United States Patent
Lin et al.

(10) Patent No.: US 9,123,418 B2
(45) Date of Patent: *Sep. 1, 2015

(54) NAND FLASH MEMORY UNIT AND NAND FLASH MEMORY ARRAY

(71) Applicant: PHISON ELECTRONICS CORP., Miaoli (TW)

(72) Inventors: Wei Lin, Taipei (TW); Riichiro Shirota, Hsinchu (TW); Nina Mitiukhina, Hsin Chu (TW); Tsai-Hao Kuo, Tainan (TW)

(73) Assignee: PHISON ELECTRONICS CORP., Miaoli (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/269,212

(22) Filed: May 5, 2014

(65) Prior Publication Data
US 2014/0239380 A1   Aug. 28, 2014

Related U.S. Application Data

(63) Continuation of application No. 13/361,916, filed on Jan. 30, 2012, now Pat. No. 8,755,227.

(51) Int. Cl.
| G11C 16/10 | (2006.01) |
| G11C 16/04 | (2006.01) |
| H01L 27/115 | (2006.01) |
| G11C 16/14 | (2006.01) |

(52) U.S. Cl.
CPC ............ G11C 16/0483 (2013.01); G11C 16/10 (2013.01); G11C 16/14 (2013.01); H01L 27/1157 (2013.01); H01L 27/11578 (2013.01)

(58) Field of Classification Search
CPC .... G11C 16/0483; G11C 16/10; G11C 16/14; G11C 16/18; G11C 11/5628; G11C 11/5635; H01L 27/1157; H01L 1127/11578
USPC ............. 365/185.17, 185.02, 185.18, 185.24, 365/185.29
See application file for complete search history.

(56) References Cited

U.S. PATENT DOCUMENTS

| 7,450,418 B2 * | 11/2008 | Liao et al. ................ 365/185.05 |
| 7,668,013 B2 * | 2/2010 | Chern et al. ............. 365/185.17 |
| 8,541,832 B2 * | 9/2013 | Kim et al. ..................... 257/324 |
| 8,563,961 B2 * | 10/2013 | Sasago et al. ...................... 257/4 |
| 8,705,274 B2 * | 4/2014 | Liu et al. .................. 365/185.03 |

* cited by examiner

Primary Examiner — Tan T. Nguyen
(74) Attorney, Agent, or Firm — Jianq Chyun IP Office

(57) ABSTRACT

A NAND flash memory unit is described, including a string of memory cells connected in series, S/D regions coupled to two terminals of the string, at least one select transistor couple between a terminal of the string and an S/D region, and at least one erase transistor couple between the at least one select transistor and an S/D region. The select transistor is for selecting the string of memory cells. The erase transistor is for reducing Vt-shift of the select transistor.

9 Claims, 3 Drawing Sheets

NAND FLASH MEMORY UNIT AND NAND FLASH MEMORY ARRAY

CROSS-REFERENCE TO RELATED APPLICATION

This application is a continuation application of and claims the priority benefit of a prior application Ser. No. 13/361,916, filed on Jan. 30, 2012, now pending. The entirety of each of the above-mentioned patent applications is hereby incorporated by reference herein and made a part of this specification.

BACKGROUND

1. Field of Invention

This invention relates to non-volatile memory, and more particularly relates to a new structure of NAND flash memory unit or 3D-array capable of reducing Vt-shift of the select transistor of NAND flash memory subjected to erasing.

2. Description of Related Art

The NAND structure is widely used in the design of non-volatile memory (NVM) apparatus to increase the storage density. A NAND flash memory unit usually includes a string of memory cells connected in series, and a select transistor couple between a terminal of the string of memory cells and an S/D region. When the cells are trapping-type cells, i.e., each cell has a charge-trapping layer, the select transistor also has a charge-trapping layer.

The NAND flash memory can be erased by applying 0V to the cell gates and the gate of the select transistor, and a high positive voltage to the S/D regions. For a high voltage difference is established between the gate of the select transistor and the channel region in the erasing, holes are injected in or electrons drawn out of the trapping layer under the gate of the select transistor, so the threshold voltage (Vt) of the select transistor is shifted adversely affecting later operations of the NAND flash memory.

Nothing, however, herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

This invention is intended to reduce Vt-shift of the select transistor of a NAND non-volatile memory subjected to erasing.

In some embodiments of this invention, a new structure of NAND flash memory unit or 3D-array is provided, in combination with a new erasing method, to reduce Vt-shift of the select transistor.

In other embodiments of this invention, a new operating method is provided to reduce Vt-shift of the select transistor while the referenced NAND flash memory structure is not changed.

The new NAND flash memory unit of this invention includes a string of memory cells connected in series, S/D regions coupled to two terminals of the string, at least one select transistor couple between a terminal of the string and an S/D region, and at least one erase transistor couple between the at least one select transistor and an S/D region. The select transistor is for selecting the string of memory cells. The erase transistor is for reducing Vt-shift of the select transistor.

In some embodiments, each of the memory cells, the at least one select transistor and the at least one erase transistor has a charge-trapping layer. In an embodiment of the method for erasing the above NAND flash memory unit of this invention, a voltage $V_{CG}$ is applied to the gates of the memory cells, a voltage $V_{S/D}$ positively higher than $V_{CG}$ to the S/D regions, a voltage $V_{SG}$ satisfying the inequality of "$V_{SG} < V_{S/D}$" to the gate of the at least one select transistor, and a voltage $V_{EG}$ satisfying the inequality of "$V_{EG} < V_{S/D}$" to the gate of the at least one erase transistor. In another exemplary embodiment of the invention, a voltage $V_{EG}$ satisfying the inequality of "$0V \leq V_{EG} < V_{S/D}$" is applied to the gate of the at least one erase transistor. In another exemplary embodiment, the gate of the at least one select transistor is floated, and a voltage $V_{CG}$ is applied to the gates of the memory cells, a voltage $V_{S/D}$ positively higher than $V_{CG}$ to the S/D regions, and a voltage $V_{EG}$ satisfying the inequality of "$V_{EG} \leq V_{S/D}$" to the gate of the at least one erase transistor. In another exemplary embodiment of the invention, a voltage $V_{EG}$ satisfying the inequality of "$0V \leq V_{EG} \leq V_{S/D}$" is applied to the gate of the at least one erase transistor.

The new 3D NAND flash memory array of this invention includes a plurality of linear stacks, a charge-trapping layer, a plurality of conductive lines, at least one select gate line and at least one erase gate line. The linear stacks are arranged in parallel, each comprising insulating layers and channel layers that are stacked alternately, wherein each channel layer has two S/D regions in its two end portions. The charge-trapping layer covers each of the linear stacks. The conductive lines cross over and extend in between the linear stacks, wherein portions of the conductive lines beside a channel layer, the channel layer, and portions of the charge-trapping layer beside the channel layer constitute a string of memory cells. The at least one select gate line is disposed neighboring to the plurality of conductive lines, crossing over and extending in between the linear stacks, wherein a portion of the at least one select gate line beside a channel layer, the channel layer, and a portions of the charge-trapping layer beside the channel layer constitute a select transistor that is for selecting a target string of memory cells. The at least one erase gate line is disposed neighboring to the least one select gate line, crossing over and extending in between the linear stacks, wherein the at least one select gate line is between the plurality of conductive lines and the at least one erase gate line, and the at least one erase gate line is for reducing Vt-shift of the select transistor.

In an embodiment of the method for erasing the above 3D NAND flash memory array of this invention, a voltage $V_{CG}$ is applied to the conductive lines, a voltage $V_{S/D}$ positively higher than $V_{CG}$ to the S/D regions, a voltage $V_{SG}$ satisfying the inequality of "$V_{SG} < V_{S/D}$" to the at least one select gate line, and a voltage $V_{EG}$ satisfying the inequality of "$V_{EG} < V_{S/D}$" to the at least one erase gate line. In another exemplary embodiment, a voltage $V_{EG}$ satisfying the inequality of "$0V \leq V_{EG} < V_{S/D}$" is applied to the at least one erase gate line. In another exemplary embodiment, the at least one select gate line is floated, and a voltage $V_{CG}$ is applied to the conductive lines, a voltage $V_{S/D}$ positively higher than $V_{CG}$ to S/D regions, and a voltage $V_{EG}$ satisfying the inequality of "$V_{EG} \leq V_{S/D}$" to the at least one erase gate line. In another exemplary embodiment, the voltage $V_{EG}$ satisfying the inequality of "$0V \leq V_{EG} \leq V_{S/D}$" is applied to the at least one erase gate line.

The new operating method of this invention, which is applied to the referenced NAND flash memory unit structure, still includes applying a voltage $V_{CG}$ to the gates of the memory cells and a voltage $V_{S/D}$ positively higher than $V_{CG}$ to S/D regions in erasing.

An embodiment of the new operating method of this invention further includes applying a voltage $V_{SG}$ satisfying the inequality of "$V_{SG} \leq V_{S/D}$" to the gate of the at least one select transistor in the erasing, so as to reduce the Vt-shift. In another exemplary embodiment, a voltage $V_{SG}$ satisfying the inequality of "$0V < V_{SG} \leq V_{S/D}$" is applied to the gate of the at least one select transistor in erasing to reduce the Vt-shift.

Another exemplary embodiment of the new operating method of this invention includes, after the erase operation wherein the gate of the at least one select transistor is also applied with the voltage $V_{CG}$ applied to the gates of the memory cells, the following steps: a) determining whether or not the Vt of the select transistor is within a tolerable range; and b) reprogramming the select transistor and going back to the step a) if the Vt of the select transistor is outside of the tolerable range, or going to an end if the Vt of the select transistor is within the tolerable range. The above steps can eliminate any Vt-shift caused by the erasing.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other objects, features and advantages of this invention comprehensible, a preferred embodiment accompanied with figures is described in detail below.

DESCRIPTION OF EMBODIMENTS

Figure 1A:
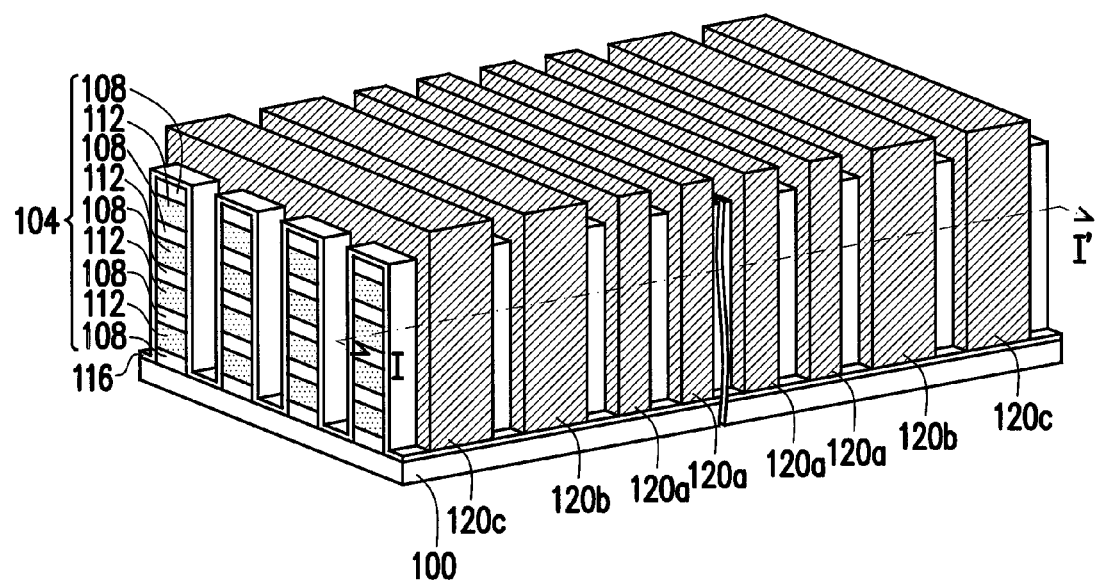
FIG. 1A illustrates a perspective view of a 3D NAND flash memory array according to a first embodiment of this invention.

Certain terminology is used in the following description for convenience only and is not limiting. Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 1B:
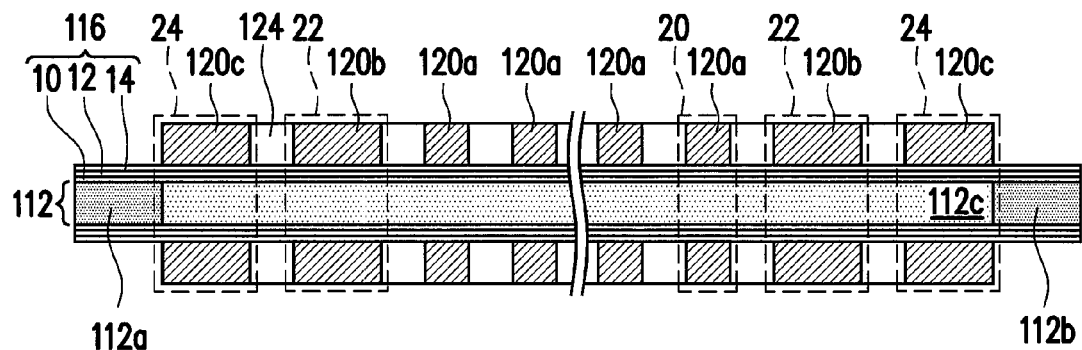
FIG. 1B illustrates the I-I' cross-sectional view of a NAND flash memory unit in the 3D NAND flash memory array.

FIG. 1A illustrates a perspective view of a three-dimension (3D) NAND flash memory array according to a first embodiment of this invention, and FIG. 1B illustrates the I-I' cross-sectional view of a NAND flash memory unit in the 3D NAND flash memory array. In this illustration, only four planes are shown. However, the number of planes can be extended to very large numbers.

Referring to FIGS. 1A & 1B, the 3D NAND flash memory array is formed based on a substrate 100, which may be an insulator substrate, a semiconductor substrate, or a metal substrate. The insulator substrate may include quartz, or glass. In another exemplary embodiment, the substrate 100 may be disposed over an underlying semiconductor or other structures (not shown). In an exemplary embodiment of the invention, The 3D NAND flash memory array includes a plurality of linear stacks 104 arranged in parallel and each including insulating layers 108 and channel layers 112 stacked alternately, a charge-trapping layer 116, a plurality of conductive lines 120a arranged in a consecutive manner, two select gate lines 120b, two erase gate lines 120c, and a dielectric layer 124 used for isolating components or structures in a circuit from each other and filled between the lines 120a, 120b and 120c. It is noted that the dielectric layer 124 is not shown in FIG. 1A so that the relationship between the lines 120a, 120b and 120c and the linear stacks 104 can be clearly shown, and in this exemplary embodiment, the substrate 100 is unsupportable for the electrical characteristics required to program or erase the flash memory array.

In this exemplary embodiment, the channel layers 112 can be configured as bit lines, the conductive lines 120a can act as word lines, the erase gate lines 120c are arranged orthogonally over the plurality of linear stacks 104, and the plurality of conductive lines have surfaces conformal with the plurality of linear stacks 104, filling the trenches defined by the plurality of linear stacks 104.

Each of the channel layers 112 has two source/drain (S/D) regions 112a and 112b in two end portions thereof, and a cell channel region 112c between the two S/D regions 112a and 112b, as shown in FIG. 1B. The material of the insulating layers 108 may include silicon dioxide. The channel layers 112 may include doped polysilicon or undoped polysilicon. In this exemplary embodiment, the channel layers 112 can have a p-type semiconductor material. The conductive lines 120a can be a semiconductor material with the same or a different conductivity type (e.g. $p^+$-type). For example, the channel layers 112 can be made using p-type polysilicon, or p-type epitaxial single crystal silicon, while the conductive lines 120a can be made using relatively heavily doped $p^+$-type polysilicon.

Alternatively, the channel layers 112 can be n-type semiconductor material. The conductive lines 120a can be a semiconductor material with the same or a different conductivity type (e.g. p+-type). This n-type strip arrangement results in buried-channel, depletion mode charge trapping memory cells. For example, the channel layers 112 can be made using n-type polysilicon, or n-type epitaxial single crystal silicon, while the conductive lines 120a can be made using relatively heavily doped p+-type polysilicon.

In another exemplary embodiment, each channel layers 112 may further have doped regions in the portions thereof between the lines 120a, 120b and 120c. The charge-trapping layer 116 covers the plurality of linear stacks 104 in this exemplary embodiment, and at least on the side walls of linear stacks 104 in another exemplary embodiment, possibly being an ONO composite layer including two silicon oxide layers 10 and 14 and a silicon nitride (SiN) layer 12 between them. As a result, a 3D array of SONOS-type memory cells configured in a NAND flash array can formed. The source region, the drain region and the channel region are formed in the silicon (S) channel layers 112, and the gate comprises polysilicon (S) of the conductive lines 120a. In another exemplary embodiment, the charge-trapping layer 116 may be an ON-high-K or oxide-nitride-oxide-nitride-oxide (ONONO) composite layer, wherein "K" means the dielectric constant. In another exemplary embodiment of the invention, the NAND flash memory could be metal-oxide-nitride-oxide-silicon (MONOS) type or tantalum-aluminum oxide-nitride-oxide-silicon (TANOS) type flash memory.

The conductive lines 120a, the select gate lines 120b and the erase gate lines 120c are all defined from the same conductive layer, which may include doped poly-Si or metal. Each of the conductive lines 120a, the select gate lines 120b and the erase gate lines 120c crosses over and extends in between the linear stacks 104, with the separation by the charge-trapping layer 116. The conductive lines 120 are arranged neighboring to each other. The two select gate lines 120b includes a first one disposed at one side of the plurality of conductive lines 120a, and a second one disposed at the other side of the same. The two erase gate lines 120c includes a first one disposed neighboring to one of the two select gate lines 120b, and a second one disposed neighboring to the other of the two select gate lines 120b. Each of the two select gate lines 120b is between the plurality of conductive lines 120a and an erase gate line 120c.

The dielectric layer 124 may include silicon dioxide. In addition, the distance between a select gate line 120b and the neighboring erase gate line 120c is sufficiently large so that the electric field caused by the voltage difference between them is lower than the breakdown electric field of the dielectric layer 124 between them. In this exemplary embodiment, the plurality of conductive lines 120a, the select gate lines 120b and the erase gate lines 120c are respectively coupled to different voltage sources (not shown).

Referring to FIG. 1B again, a portion of a conductive line 120a as a cell gate between two linear stacks 104, a corresponding portion of the charge-trapping layer 116 and a corresponding portion of a channel layer 112 constitute a memory cell 20. To be specific, in this exemplary embodiment, a memory cell 20 can be formed at the intersection of two adjacent conductive lines 102a and one of the channel layers 112. A portion of a select gate line 120b as a select gate between two linear stacks 104, a corresponding portion of the charge-trapping layer 116 and a corresponding portion of a channel layer 112 constitute a select transistor 22 for selecting the corresponding string of memory cells or selecting columns along the ridge-shaped stacks in the array. A portion of an erase gate line 120c as an erase gate between two linear stacks 104, a corresponding portion of the charge-trapping layer 116 and a corresponding portion of a channel layer 112 constitute an erase transistor 24 to generate electron-hole pairs for reducing a threshold voltage shift (Vt-shift) on the select transistor 22.

Figure 2:
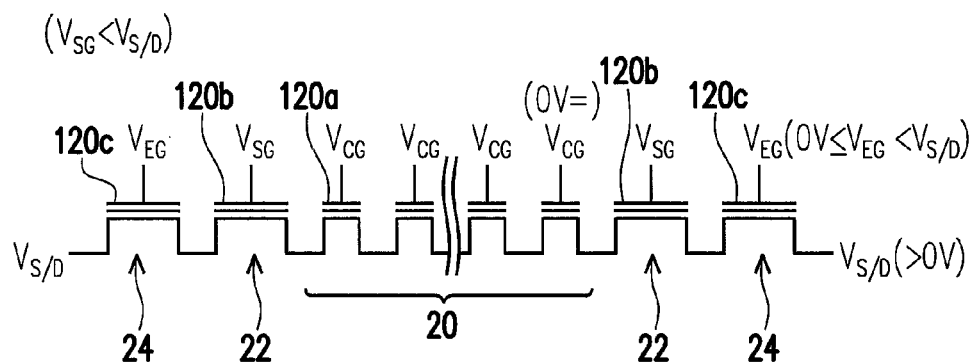
FIGS. 2-3 illustrate an equivalent circuit diagram of the NAND flash memory unit in FIG. 1B, and two methods for erasing the memory unit or the above 3D NAND flash memory array according to second and third embodiments of this invention.
Figure 3:
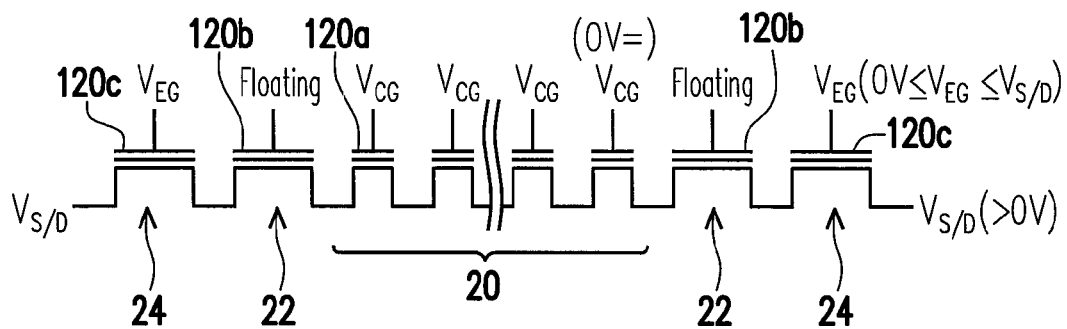

FIGS. 2-3 illustrate an equivalent circuit diagram of the NAND flash memory unit in FIG. 1B, and two methods for erasing the memory unit or the 3D NAND flash memory array according to second and third embodiments of this invention. In this exemplary embodiment, a plurality of gates of the memory cells 20 are coupled to a first voltage source (not shown), the gates of the select transistors 22 are coupled to a second voltage source (not shown), and the gates of the erase transistors 24 are coupled to a third voltage source (not shown), wherein the first voltage source, the second voltage source, and the third voltage source could be different from each other.

Referring to FIG. 2, the first erase transistor 24, the first select transistor 22, the memory cells 20, the second select transistor 22 and the second erase transistor 24 are connected in series in sequence. In the erase operation of the second embodiment of this invention, a voltage $V_{CG}$ is applied to each of the cell gates 120a, a voltage $V_{S/D}$ positively higher than $V_{CG}$ to the S/D regions, a voltage $V_{SG}$ satisfying the inequality of "$V_{SG} < V_{S/D}$" to each of the select gates 120b, and a voltage $V_{EG}$ satisfying the inequality of "$V_{EG} < V_{S/D}$" to each of the erase gates 120c. In another exemplary embodiment of the invention, a voltage $V_{EG}$ satisfying the inequality of "$0V \leq V_{EG} < V_{S/D}$" is applied to the gate of the at least one erase transistor.

Accordingly, in the corresponding erasing of the entire 3D NAND flash memory array shown in FIG. 1A/B, the voltage $V_{CG}$ is applied to each of the conductive lines 120a, the voltage $V_{S/D}$ to the S/D regions 112a and 112b, the voltage $V_{SG}$ to each of the select gate lines 120b, and the voltage $V_{EG}$ to each of the erase gate lines 120c.

In an example of the second embodiment, $V_{CG}=0V$, $V_{S/D}$ is about 20V, $V_{SG}$ ranges from 10 V to 20 V, and $V_{EG}$ ranges from 0 V to 16 V.

Since an erase transistor is inserted between the S/D region and the select gate in this embodiment, electron-hole pairs are generated at the edge of the channel region of the erase transistor. The generated holes will accumulate inside the channel layer 112 so that the electrical potential of channel layer 112 becomes high. Hence, Vt-shift of the select transistors is reduced and the subsequent operations of the NAND flash memory are not adversely affected.

Referring to FIG. 3, in the erase operation of the third embodiment of this invention, each of the select gates 120b is floated, and a voltage $V_{CG}$ is applied to each of the cell gates 120a, a voltage $V_{S/D}$ positively higher than $V_{CG}$ to the S/D regions, and a voltage $V_{EG}$ satisfying the inequality of "$V_{EG} \leq V_{S/D}$" to each of the erase gates 120c. In another exemplary embodiment of the invention, a voltage $V_{EG}$ satisfying the inequality of "$0V \leq V_{EG} \leq V_{S/D}$" is applied to the gate of the at least one erase transistor.

Accordingly, in the corresponding erasing of the entire 3D NAND flash memory array shown in FIG. 1A/B, each of the select gate lines 120b is floated, and the voltage $V_{CG}$ is applied to each of the conductive lines 120a, the voltage $V_{S/D}$ to the S/D regions 112a and 112b, and the voltage $V_{EG}$ to each of the erase gate lines 120c.

In an example of the third embodiment, $V_{CG}=0V$, $V_{S/D}$ is about 20V, and $V_{EG}$ ranges from 0 V to 16 V.

Since an erase transistor is inserted between the S/D region and the select gate in this embodiment, electron-hole pairs are generated at the edge of the channel region of the erase transistor. The generated holes will accumulate inside the channel layer 112 so that the electrical potential of channel layer 112 becomes high. Hence, Vt-shift of the select transistors is reduced and the subsequent operations of the NAND flash memory are not adversely affected.

In addition, in the above erase operation of the second or third embodiment applied to the new NAND flash memory unit of this invention with erase gates, all the gates including the erase gates in the unselected blocks may be floated.

On the other hand, in the programming or reading of the new NAND flash memory unit, it is feasible to float all the erase gates in the unselected blocks and apply a positive voltage to all the erase gates in the selected block, while the voltages applied to the cell gates and the select gates in the unselected blocks and the selected block are the same as those applied in the prior art.

Figure 4:
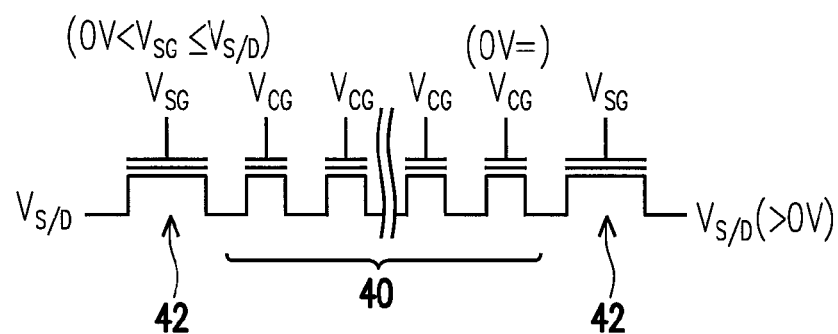
FIG. 4 illustrates a method for solving the Vt-shift issue of at least one select transistor of a NAND flash memory unit subjected to erasing, according to a fourth embodiment of this invention.

FIG. 4 illustrates a method for solving the Vt-shift issue of at least one select transistor of a NAND flash memory unit subjected to erasing, according to a fourth embodiment of this invention. The method is applied to a referenced NAND flash memory unit structure without an erase transistor.

Referring to FIG. 4, the referenced NAND flash memory unit structure is different from that shown in FIG. 2 or 3 in lacking the erase transistors. In the erase operation of this embodiment, a voltage $V_{CG}$ is applied to the gates of the memory cells 40, a voltage $V_{S/D}$ positively higher than $V_{CG}$ to the S/D regions, and a voltage $V_{SG}$ satisfying the inequality of "$0V<V_{SG}\leq V_{S/D}$" to the gate of each of the select transistors 42.

Since the gate of each select transistor 42 is applied with a voltage $V_{SG}$ satisfying the inequality of "$0V<V_{SG}\leq V_{S/D}$" in this embodiment, electron-hole pairs are generated at the edge of the channel region of select transistor 42. The generated holes will accumulate inside the channel layer 112 so that the electrical potential of channel layer 112 becomes high. Because the select gate voltage is higher than 0V, the Vt-shift of the select gate can be reduced. Thereby, the subsequent operations of the NAND flash memory are not adversely affected.

Figure 5:
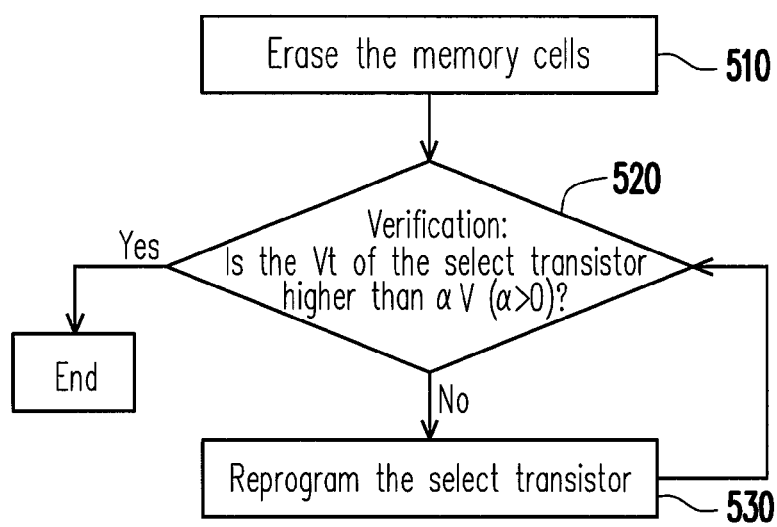
FIG. 5 illustrates another method for solving the Vt-shift issue of at least one select transistor of a NAND flash memory unit subjected to erasing, according to a fifth embodiment of this invention.

FIG. 5 illustrates another method for solving the Vt-shift issue of at least one select transistor of a referenced NAND flash memory unit structure (see FIG. 4) subjected to erasing, according to a fifth embodiment of this invention. The method is applied after a referenced erase operation wherein a voltage $V_{CG}$ is applied to the gates of the memory cells and the gate of the at least one select transistor and a voltage $V_{S/D}$ positively higher than $V_{CG}$ applied to the S/D regions.

Referring to FIG. 5, after the erase operation 510, whether or not the Vt of the select transistor is within a tolerable range is determined (step 520). If the Vt of the select transistor is determined to be outside of the tolerable range, the select transistor is reprogrammed (step 530) and the operation goes back to the step 520. If the Vt is determined to be within the tolerable range, the operation goes to the end.

In an embodiment, the tolerable range is being higher than $\alpha$ V ($\alpha>0$), and the reprogramming may include injecting electrons in the charge-trapping layer of the at least one select transistor.

With the method of the above fifth embodiment of this invention, the Vt-shift of the select transistors caused by erasing can be eliminated so that later operations of the NAND flash memory are not adversely affected.

Figure 6A:
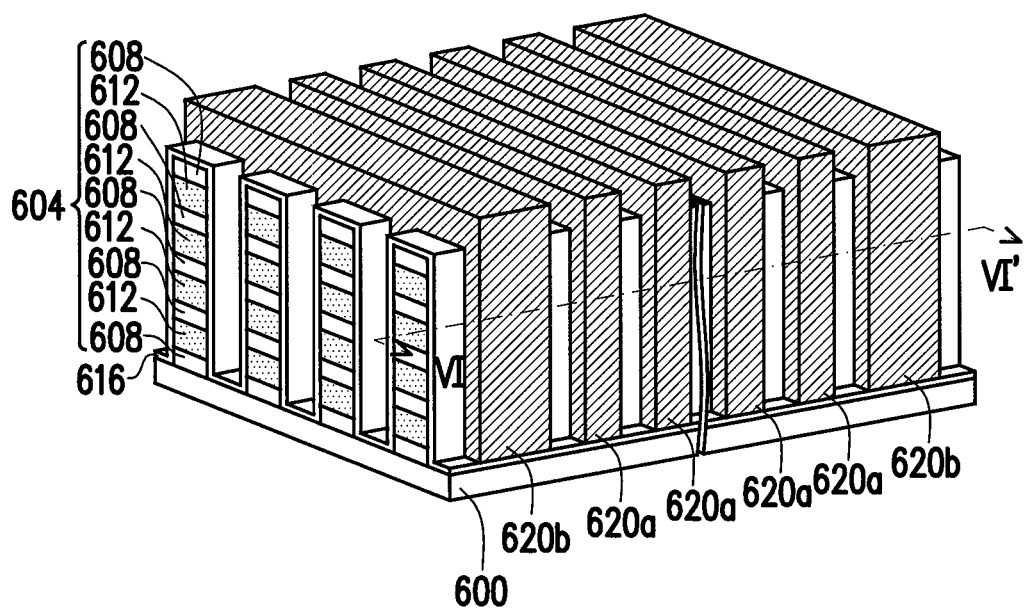
FIG. 6A illustrates a perspective view of a referenced 3D NAND flash memory array to which the method of the fourth or fifth embodiment of this invention can be applied.

The methods of the above fourth and fifth embodiments of this invention can be applied to various referenced NAND flash memory structures, such as a referenced 3D NAND flash memory array of which a perspective view is shown in FIG. 6A. FIG. 1B illustrates the VI-VI' cross-sectional view of a NAND flash memory unit in the referenced 3D NAND flash memory array shown in FIG. 6A.

Figure 6B:
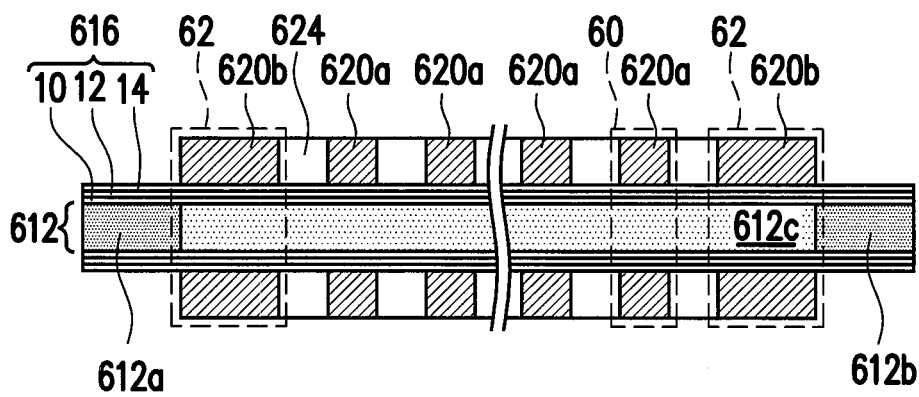
FIG. 6B illustrates the VI-VI' cross-sectional view of a NAND flash memory unit in the referenced 3D NAND flash memory array.

Referring to FIGS. 6A & 6B, the referenced 3D NAND flash memory array is different from that in the first embodiment of this invention in lacking erase gate lines and erase transistors, while the substrate 600, the linear stacks 604, the insulating layers 608 and the channel layers 612 (each including a cell channel region 612c between the two S/D regions 612a and 612b) in the linear stacks 604, the charge-trapping layer 616, the conductive lines 620a, the select gate lines 620b, the dielectric layer 624, the memory cells 60 and the select transistors 62 are similar to their analogues 100, 104, 108, 112, 116, 120a, 120b, 124, 20 and 22 in the first embodiment.

When the method of the fourth embodiment of this invention is applied to the referenced 3D NAND flash memory array, a voltage $V_{CG}$ is applied to conductive lines 620a or the gates of the memory cells 60, a voltage $V_{S/D}$ positively higher than $V_{CG}$ to the S/D regions 612a and 612b, and a voltage $V_{SG}$ satisfying the inequality of "$0V<V_{SG}\leq V_{S/D}$" to the select gate lines 620b or the gates of the select transistors 62.

By applying any of the above embodiments of this invention, Vt-shift of the select transistor of a NAND flash memory unit or array subjected to erasing can be reduced. Thus, later operations of the NAND flash memory are not adversely affected.

The methods of the above second to fifth embodiments of this invention can also be applied to NAND flash memory having a charge storage layer by use of SiN or another element in a dielectric charge-trapping structure to storage electrons on a semiconductor-on-insulator (SOI) substrate, vertical-channel 3D NAND flash memory, such as BiCS and other kinds of NAND Flash memories without substrate contacts.

The previously described exemplary embodiments of the present invention have the advantages aforementioned, wherein the advantages aforementioned not required in all versions of the invention.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A NAND flash memory unit, comprising:
   a string of memory cells connected in series;
   two source/drain (S/D) regions coupled to two terminals of the string of memory cells;
   at least one select transistor coupled between a terminal of the string and an S/D region, for selecting the string of memory cells; and
   at least one erase transistor coupled between the at least one select transistor and the one of the two S/D regions,
   wherein a voltage $V_{CG}$ is applied to gates of the memory cells, a voltage $V_{S/D}$ positively higher than the voltage $V_{CG}$ is applied to the S/D regions, a voltage $V_{SG}$ satisfying an inequality of "$V_{SG}<V_{S/D}$" is applied to a gate of the at least one select transistor, and a voltage $V_{EG}$ satisfying the inequality of "$0V\leq V_{EG}<V_{S/D}$" is applied to the gate of the at least one erase transistor.

2. The NAND flash memory unit of claim 1, wherein $V_{CG}=0V$, $V_{S/D}$ is smaller than 20V, $V_{SG}$ ranges from 10 V to 20 V, and $V_{EG}$ ranges from 0 V to 16 V.

3. A NAND flash memory unit, comprising:
   a string of memory cells connected in series;
   two source/drain (S/D) regions coupled to two terminals of the string of memory cells;
   at least one select transistor coupled between a terminal of the string and one of the two S/D regions, for selecting the string of memory cells; and
   at least one erase transistor coupled between the at least one select transistor and the one of the two S/D regions, wherein a gate of the at least one select transistor is floated, a voltage $V_{CG}$ is applied to gates of the memory cells, a voltage $V_{S/D}$ positively higher than the voltage $V_{CG}$ is applied to the S/D regions, and a voltage $V_{EG}$ satisfying the inequality of "$0V \leq V_{EG} < V_{S/D}$" is applied to the gate of the at least one erase transistor.

4. The NAND flash memory unit of claim 3, wherein $V_{CG}=0V$, $V_{S/D}$ is smaller than 20V, and $V_{EG}$ ranges from 0 V to 16 V.

5. A NAND flash memory unit, comprising:
a string of memory cells connected in series;
two source/drain (S/D) regions coupled to two terminals of the string of memory cells;
at least one select transistor coupled between a terminal of the string and one of the two S/D regions, for selecting the string of memory cells; and
at least one erase transistor coupled between the at least one select transistor and the one of the two S/D regions,
wherein when the NAND flash memory unit is being programmed or read, a positive voltage is applied to all the erase gates in a selected block.

6. The NAND flash memory unit of claim 5, wherein all the erase gates in unselected blocks are floated.

7. A 3D NAND flash memory array, comprising:
a plurality of linear stacks arranged in parallel, each stack comprising a plurality of insulating layers and a plurality of channel layers that are stacked alternately, wherein each channel layer has two S/D regions in two end portions thereof, and the channel layers are disposed on a side of a substrate;
a charge-trapping layer covering each of the linear stacks;
a plurality of conductive lines crossing over and extending in between the linear stacks, wherein portions of the conductive lines beside a channel layer, the channel layer, and portions of the charge-trapping layer beside the channel layer constitute a string of memory cells;
at least one select gate line neighboring to the plurality of conductive lines, crossing over and extending in between the linear stacks, wherein a portion of the at least one select gate line beside a channel layer, the channel layer, and a portions of the charge-trapping layer beside the channel layer constitute a select transistor that is for selecting a target string of memory cells; and
at least one erase gate line neighboring to the least one select gate line, crossing over and extending in between the linear stacks, wherein the at least one select gate line is between the plurality of conductive lines and the at least one erase gate line, and the at least one erase gate line is for reducing a threshold voltage (Vt) shift of the select transistor.

8. The 3D NAND flash memory array of claim 7, wherein the channel layers are perpendicular to the substrate.

9. The 3D NAND flash memory array of claim 7, wherein the channel layers are parallel to the substrate.

* * * * *